US010068043B1

(12) United States Patent
Ho

(10) Patent No.: US 10,068,043 B1
(45) Date of Patent: Sep. 4, 2018

(54) VALIDATING INTEGRATED CIRCUIT SIMULATION RESULTS

(71) Applicant: Worldwide Pro Ltd., Hong Kong (CN)

(72) Inventor: William Wai Yan Ho, Cupertino, CA (US)

(73) Assignee: Worldwide Pro Ltd., Hong Kong (CN)

( * ) Notice: Subject to any disclaimer, the term of this patent is extended or adjusted under 35 U.S.C. 154(b) by 0 days.

(21) Appl. No.: 15/276,668

(22) Filed: Sep. 26, 2016

Related U.S. Application Data

(60) Continuation of application No. 14/839,824, filed on Aug. 28, 2015, now Pat. No. 9,454,637, which is a continuation of application No. 14/271,189, filed on May 6, 2014, now Pat. No. 9,122,837, which is a continuation of application No. 13/340,329, filed on Dec. 29, 2011, now Pat. No. 8,179,760, which is a continuation of application No. 12/238,880, filed on Sep. 26, 2008, now Pat. No. 8,166,425, which is a division of application No. 11/279,391, filed on Apr. 11, 2006, now Pat. No. 7,461,360.

(51) Int. Cl.
G06F 9/455 (2018.01)
G06F 17/50 (2006.01)

(52) U.S. Cl.
CPC .................. *G06F 17/504* (2013.01)

(58) Field of Classification Search
CPC ....................................................... G06F 17/504
USPC ........................................................... 716/109
See application file for complete search history.

(56) References Cited

U.S. PATENT DOCUMENTS

| | | | |
|---|---|---|---|
| 5,379,231 A | 1/1995 | Pillage et al. | |
| 5,446,676 A | 8/1995 | Huang et al. | |
| 5,515,302 A * | 5/1996 | Horr | G01R 31/3004 326/21 |
| 5,708,379 A * | 1/1998 | Yosinski | G01R 31/00 327/129 |
| 6,604,066 B1 | 8/2003 | Hatsuda | |
| 6,807,520 B1 | 10/2004 | Zhou et al. | |
| 7,694,242 B1 * | 4/2010 | Li | G06F 17/5045 716/100 |
| 7,827,016 B1 | 11/2010 | Ho | |
| 2002/0053912 A1 | 5/2002 | Saha et al. | |
| 2006/0095870 A1 * | 5/2006 | Tai | G06F 17/5068 716/120 |
| 2010/0180240 A1 * | 7/2010 | Davis | G06F 17/5031 716/113 |

* cited by examiner

Primary Examiner — Suresh Memula
(74) Attorney, Agent, or Firm — Aka Chan LLP

(57) ABSTRACT

A technique validates results from a circuit simulation estimation program. The technique determines whether the estimated results satisfy Kirchhoff's current law (KCL), Kirchhoff's voltage laws (KVL), and power conservation for the original circuit. A reporting tool shows the validation results and may be customized by the user. The tool can show in the original circuitry where the estimated results may be inaccurate.

20 Claims, 9 Drawing Sheets

VALIDATING INTEGRATED CIRCUIT SIMULATION RESULTS

CROSS-REFERENCE TO RELATED APPLICATIONS

This patent application is a continuation of U.S. patent application Ser. No. 14/839,824, filed Aug. 28, 2015, issued as U.S. Pat. No. 9,454,637 on Sep. 27, 2016, which is a continuation of U.S. patent application Ser. No. 14/271,189, filed May 6, 2014, issued as U.S. Pat. No. 9,122,837 on Sep. 1, 2015, which is a continuation of U.S. patent application Ser. No. 13/340,329, filed Dec. 29, 2011, issued as U.S. Pat. No. 8,719,760 on May 6, 2014, which is a continuation of U.S. patent application Ser. No. 12/238,880, filed Sep. 26, 2008, issued as U.S. Pat. No. 8,166,425 on Apr. 24, 2012, which is a divisional of U.S. patent application Ser. No. 11/279,391, filed Apr. 11, 2006, issued as U.S. Pat. No. 7,461,360 on Dec. 2, 2008. These patent applications are incorporated by reference.

BACKGROUND OF THE INVENTION

The present invention relates to the field of electronic design automation for electronic circuits, and more specifically to techniques of validating simulation results for electronic circuits, especially when simulated using an approximation or reduction method.

The age of information and electronic commerce has been made possible by the development of electronic circuits and their miniaturization through integrated circuit technology. Integrated circuits are sometimes referred to as "chips." Some type of integrated circuits include digital signal processors (DSPs), amplifiers, dynamic random access memories (DRAMs), static random access memories (SRAMs), erasable programmable read only memories (EPROMs), electrically erasable programmable read only memories (EEPROMs), Flash memories, microprocessors, application specific integrated circuits (ASICs), and programmable logic Integrated circuits have been widely adopted and are used in many products in the areas of computers and other programmed machines, consumer electronics, telecommunications and networking equipment, wireless network and communications, industrial automation, and medical instruments, just to name a few. Electronic circuits and integrated circuits are the foundation of the Internet and other on-line technologies including the World Wide Web (WWW).

There is a continuing demand for electronic products that are easier to use, more accessible to greater numbers of users, provide more features, and generally address the needs of consumers and customers. Integrated circuit technology continues to advance rapidly. With new advances in technology, more of these needs are addressed. Furthermore, new advances may also bring about fundamental changes in technology that profoundly impact and greatly enhance the products of the future.

To meet the challenges of building more complex and higher performance integrated circuits, software tools are used. These tools are in an area commonly referred to as computer aided design (CAD), computer aided engineering (CAE), or electronic design automation (EDA). There is a constant need to improve these electronic automatic tools in order to address the desire for higher integration and greater complexity, and better performance in integrated circuits.

Large modern day integrated circuits have millions of devices including gates and transistors, and are very complex. As process technology improves, more and more devices may be fabricated on a single integrated circuit, so integrated circuits will continue to become even larger and more complex with time. In the past, many parasitic effects may not have been considered because they were less significant or insignificant compared to other factors.

As lithography and miniaturization techniques advance, on-chip devices and line widths become smaller, frequencies increase. As a consequence, many more impedances such as parasitic resistances, inductances, and capacitances and parasitic effects need to be considered. If these parasitics and effects are not taken into account, poor simulation results will result, and possible the electronic circuits will not work as expected after the circuit is fabricated. As more and more parasitic and other effects are accounted for, the circuit networks to be simulated become larger and much more complex. Further, electronic systems at the board level are becoming more complex, thus increasing circuit network simulation size and complexity. As network size and complexity increases, simulating the network takes significantly more computing resources and computation time.

Simulating large, complex networks to obtain an exact solution is time consuming. Such simulations can take may take many hours, days, or even weeks. Circuit simulation is an order n-cubed problem. So, as the number of nodes increases, the time increases significantly. Therefore, to reduce the simulation time, approximation or reduction methods are used to simulate the networks. Some of these techniques are known as fast-Spice or fast-MOS techniques.

These techniques estimate the simulation results, and do not provide an exact solution. In an approximation method approach, certain circuit information is thrown away or not considered. The approach may be iterative. By reducing the amount of information to consider, the estimated simulation results may be obtained much faster than trying to find the exact solution. For example, an exact solution for a circuit with 600,000 nodes may be obtained in 38 hours with Spice, but using an approximation method, the results may be obtained in 10 minutes.

There are shortcomings to the approximation or reduction approaches to circuit simulation because they trade off accuracy for performance. Accuracy is reduced because the estimated simulation results are estimates rather than an exact solution. Further, even though the developer of the circuit simulation estimation software markets the estimated results as being accurate, the user will not know the degree of accuracy of the simulation results. For some circuit networks, an approach may provide results which are within 1 percent of the exact solution, which may be acceptable depending on the circuitry. But for some circuit networks, the same approach may give results that are more than 5 percent off, which may be unacceptable.

Therefore, there is a need for techniques of validating the results from circuit simulation estimation software.

SUMMARY OF THE INVENTION

A technique validates results from a circuit simulation estimation program. The technique determines whether the estimated results satisfy Kirchhoff's current law (KCL), Kirchhoff's voltage laws (KVL), and power conservation for the original circuit. A reporting tool shows the validation results and may be customized by the user. The tool can show in the original circuitry where the estimated results may be inaccurate.

In an implementation, the invention provides a method including providing a first database of a circuit, where a voltage is associated with each node of the circuit; identifying independent loops of the circuit; summing the voltages for each identified loop and storing the loop sum results in a second database; summing the currents at each node of the circuit and storing the node sum results in the second database; summing power consumption of each branch of the circuit and storing the total branch power in the second database; and storing input power to the circuit in the second database.

The method further includes providing for display on a display the loop sum for each loop of the circuit; providing for display on the display the node sum for each node of the circuit; and providing for display on the display the input power to the circuit and the total branch power.

In another implementation, the invention provides a method including providing a circuit network specified in a netlist format and input sources associated with the circuit; providing a simulation output for the circuit, where the simulation output includes node voltages for each node of the circuit; building a graph data structure from the circuit netlist; using the node voltages, determining branch voltages for branches in the graph; identifying a tree and links in the graph; and identifying independent loops in the graph.

The method further includes summing the voltages for each independent loop in the graph; summing the currents at each node in the graph; summing power consumed for each branch in the graph to obtain a total power consumed; determining a total input power to the circuit network using the input sources associated with the circuit; and subtracting the total power consumed from the total input power to obtain a total power difference.

The method further includes indicating a not validated condition when at least one of the loops in the graph has a nonzero sum; indicating a not validated condition when at least one of the nodes in the graph has a nonzero sum; and indicating a not validated condition when the total power difference is not zero.

In another implementation, the invention provides a method including a method including providing a netlist of a circuit; providing simulation results for the circuit; using the simulation results, evaluating Kirchhoff's current law for each node of the circuit; using the simulation results, evaluating Kirchhoff's voltage law for each independent loop of the circuit; and determining whether input power to the circuit equals power consumed by the circuit. The simulation results may be obtained by using an approximation technique or reduction approach. The simulation results will be indicated as valid only when Kirchhoff's current law is satisfied, Kirchhoff's voltage law is satisfied, and input power equals power consumed.

Other objects, features, and advantages of the present invention will become apparent upon consideration of the following detailed description and the accompanying drawings, in which like reference designations represent like features throughout the figures.

DETAILED DESCRIPTION

Figure 1:
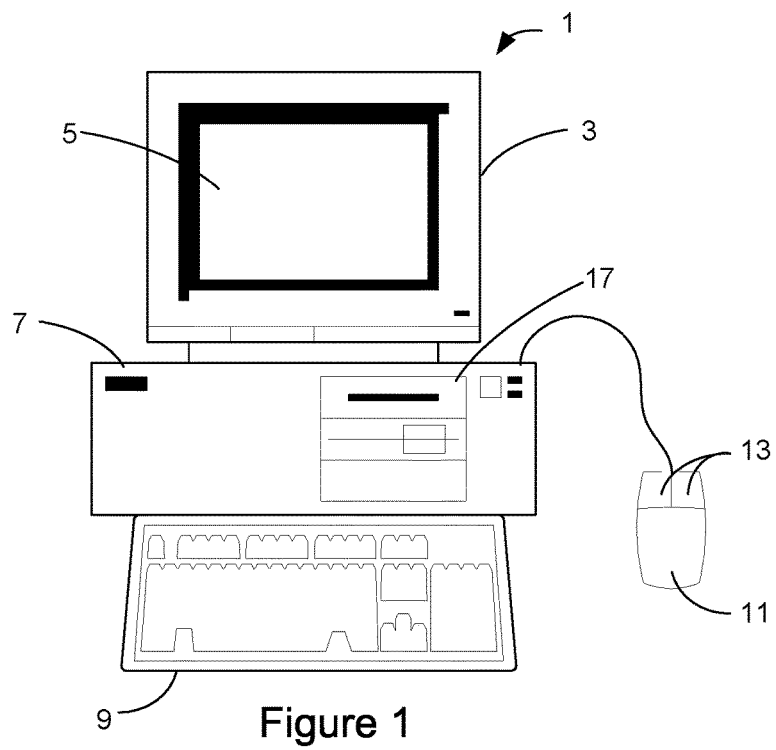
FIG. 1 shows a system of the present invention for performing integrated circuit simulation.

FIG. 1 shows an electronic design automation (EDA) system of the present invention for validating circuit simulation results when designing an electronic circuit or integrated circuit, including circuit simulations of the entire integrated circuit, portions of the integrated circuit, or circuit blocks. In an embodiment, the invention is software that executes on a computer workstation system, such as shown in FIG. 1. FIG. 1 shows a computer system 1 that includes a monitor 3, screen 5, cabinet 7, keyboard 9, and mouse 11. In some implementations, however, electronic design automation systems are operated headless, which means these systems will not a mouse, keyboard, display, and so forth.

Mouse 11 may have one or more buttons such as mouse buttons 13. Cabinet 7 houses familiar computer components, some of which are not shown, such as a processor, memory, mass storage devices 17, and the like. Mass storage devices 17 may include mass disk drives, floppy disks, magnetic disks, optical disks, fixed disks, hard disks, CD-ROMs, recordable CDs, DVDs, DVD-ROMs, recordable DVDs, Flash and other nonvolatile solid-state storage, tape storage, reader, and other similar media, and combinations of these. A binary machine-executable version of the software of the present invention may be stored or reside on mass storage devices 17. Furthermore, the source code of the software of the present invention may also be stored or reside on mass storage devices 17 (e.g., magnetic disk, tape, CD-ROM, or DVD).

Figure 2:
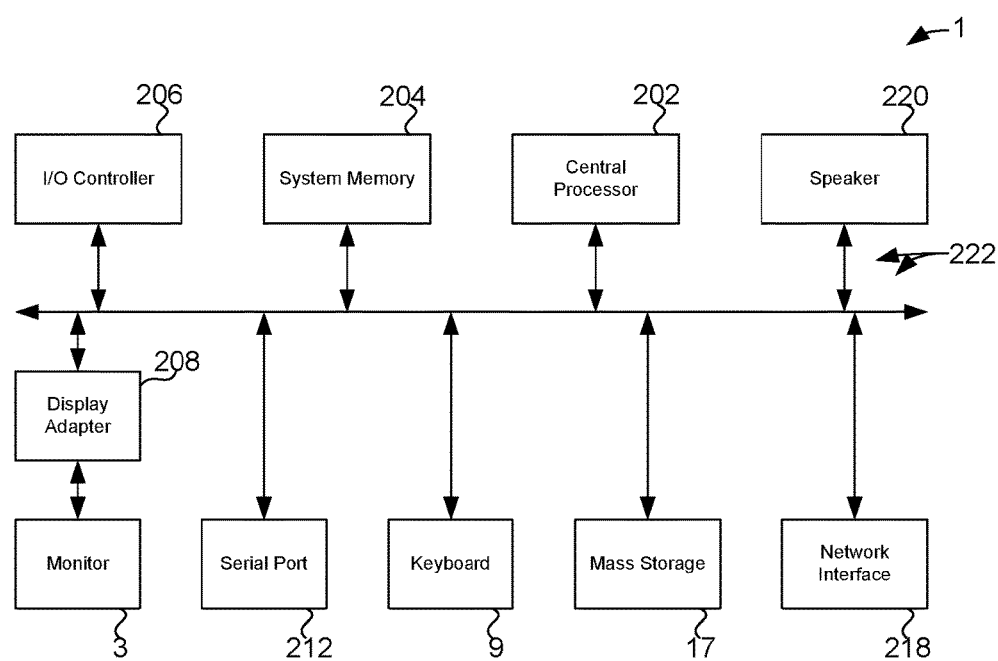
FIG. 2 shows a simplified system block diagram of a computer system used to execute software of the invention.

Further, FIG. 2 shows a system block diagram of computer system 1 used to execute software of the present invention. As in FIG. 1, computer system 1 includes monitor 3, keyboard 9, and mass storage devices 17. Computer system 1 further includes subsystems such as central processor 202, system memory 204, input/output (I/O) controller 206, display adapter 208, serial or universal serial bus (USB) port 212, network interface 218, and speaker 220. The invention may also be used with computer systems with additional or fewer subsystems. For example, a computer system could include more than one processor 202 (i.e., a multiprocessor system) or the system may include a cache memory.

The processor may be a dual core or multicore processor, where there are multiple processor cores on a single integrated circuit. The system may also be part of a distributed computing environment. In a distributed computing environment, individual computing systems are connected to a network and are available to lend computing resources to another system in the network as needed. The network may be an internal ethernet network, Internet, or other network. Some examples of distributed computer systems for solving problems over the Internet include Folding@home, SETI@home, and the Great Internet Mersenne Prime Search (GIMPS).

Arrows such as 222 represent the system bus architecture of computer system 1. However, these arrows are illustrative of any interconnection scheme serving to link the subsystems. For example, speaker 220 could be connected to the other subsystems through a port or have an internal connection to central processor 202. Computer system 1 shown in FIG. 1 is but an example of a computer system suitable for use with the present invention. Other configurations of subsystems suitable for use with the present invention will be readily apparent to one of ordinary skill in the art.

Computer software products may be written in any of various suitable programming languages, such as C, C++, Pascal, Fortran, Perl, MatLab (from MathWorks, Inc.), SAS, SPSS, Java, and AJAX. The computer software product may be an independent application with data input and data display modules. Alternatively, the computer software products may be classes that may be instantiated as distributed objects. The computer software products may also be component software such as Java Beans (from Sun Microsystems) or Enterprise Java Beans (EJB from Sun Microsystems).

An operating system for the system may be one of the Microsoft Windows® family of operating systems (e.g., Windows 95, 98, Me, Windows NT, Windows 2000, Windows XP, Windows XP x64 Edition, Windows Vista), Linux, HP-UX, UNIX, Sun OS, Solaris, Mac OS X, Alpha OS, AIX, IRIX32, or IRIX64, or combinations of these. Other operating systems may be used. Each computer in a distributed computing environment may use a different operating system.

Furthermore, the computer may be connected to a network and may interface to other computers using this network. For example, each computer in the network may perform part of the task of the many series of circuit simulation steps in parallel. Furthermore, the network may be an intranet, internet, or the Internet, among others. The network may be a wired network (e.g., using copper), telephone network, packet network, an optical network (e.g., using optical fiber), or a wireless network, or any combination thereof. For example, data and other information may be passed between the computer and components (or steps) of a system of the invention using a wireless network using a protocol such as Wi-Fi (IEEE standards 802.11, 802.11a, 802.11b, 802.11e, 802.11g, 802.11i, and 802.11n, just to name a few examples). For example, signals from a computer may be transferred, at least in part, wirelessly to components or other computers.

A specific type of electronic design automation tool is a circuit simulation program or system. A circuit simulation program performs analysis of circuits containing resistors, capacitors, inductors, mutual inductors, independent voltage and current sources, dependent sources, transmission lines, and semiconductor devices including diodes, bipolar junction transistors (BJTs), junction field effect transistors (JFETs), and metal over semiconductor field effect transistors (MOSFETs). A circuit simulator may perform nonlinear DC, nonlinear transient, linear AC, and other analyses.

One circuit simulation program is SPICE, originating from the University of California, Berkeley. SPICE stands for "Simulation Program Integrated Circuits Especially!" Despite the success of SPICE and other circuit simulation programs, existing circuit simulation programs use methodology and computational techniques not suitable for use in distributed computing environment and determining real or exact solutions.

Figure 3:
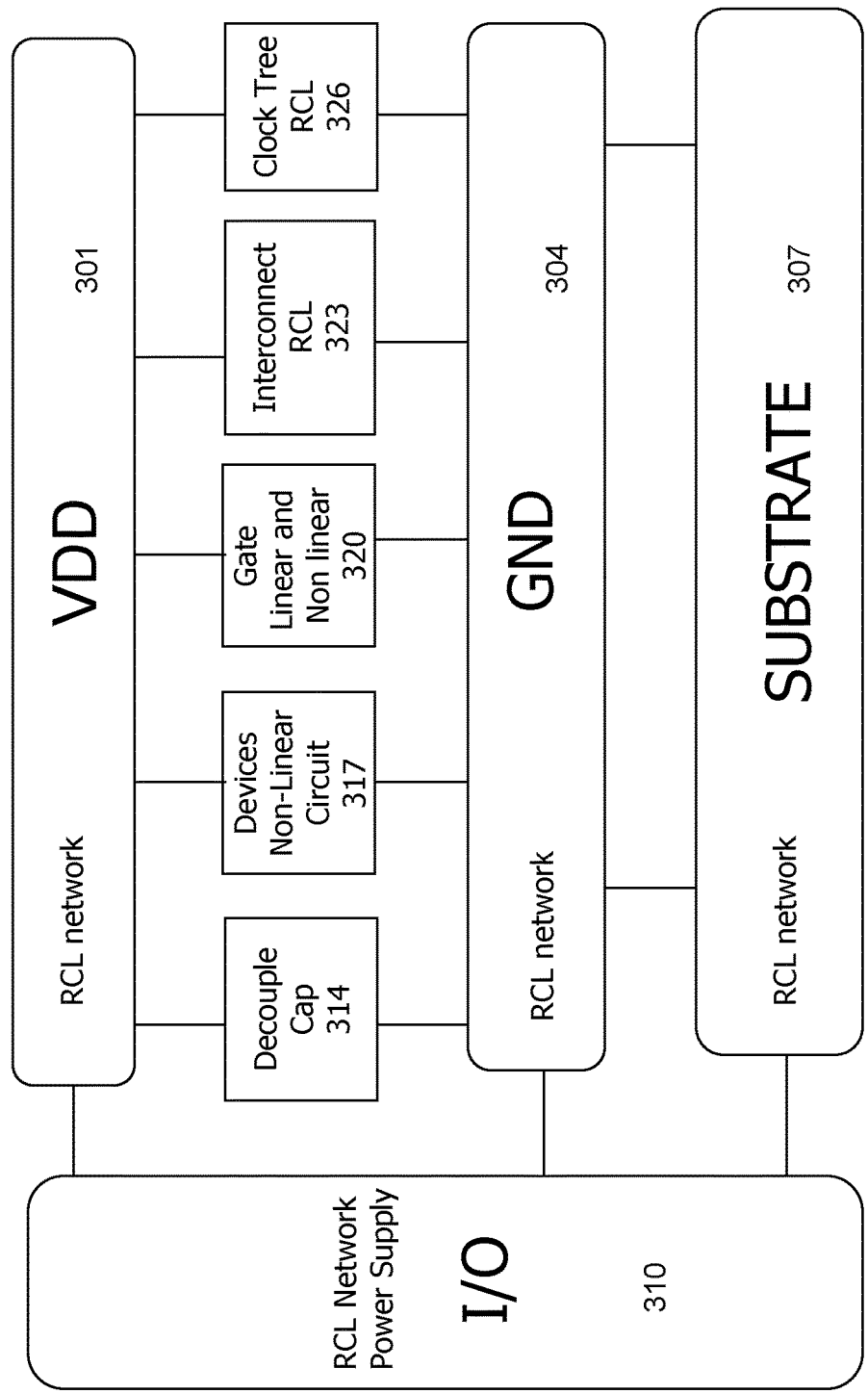
FIG. 3 shows a typical modeling of an integrated circuit for circuit simulation.

FIG. 3 shows a typical modeling of a circuit or integrated circuit for circuit simulation. The model uses resistance, capacitance, inductance, and nonlinear devices. The model has two supply networks, VDD 301 and ground (GND) 304, and a substrate network 307. VDD, GND, and the substrate may be more specifically modeled using a resistance-capacitance-inductance (RCL) network. A power supply or other input-output (I/O) 310 are connected to the VDD, GND, and substrate. The power supply may be modeled using a resistance-capacitance-inductance (RCL) network. There may be more supplies then VDD and ground, and these would be modeled similarly to VDD, GND, and substrate.

Between VDD and GND, there may be various components or devices including decoupling capacitors 314, devices nonlinear circuits, gates linear and nonlinear, interconnect RCL, and clock tree RCL. Examples of devices nonlinear circuits include transistors, BJT and MOS, and diodes. Examples of gates linear and nonlinear include NAND, NOR, OR, AND, logic blocks, intellectual property (IP) blocks, and others.

Any one or more components or devices may be connected to VDD and GND, and in any combination. For example, one or more transistors may be connected between the supplies. The transistors may form an amplifier, NAND gate, or other circuit that is to be simulated according to this model.

In circuit simulation, a circuit or component is represented using an RCL network and sources. For example, a bipolar junction transistor (BJT) may be represented using a hybrid-pi model, which has resistances, capacitances, and a dependent current source. A MOSFET transistor may be modeled using, for example, a BSIM or other model. The model representation of a device or other component may be referred to as its equivalent circuit. It can be appreciated as an electronic circuit has more and more transistors, gates, and other components, the equivalent model of the electronic circuit becomes a much more complicated RCL network with sources. As a circuit gets larger and there are more nodes and branches, the simulation of the circuit becomes more complicated, taking more time, memory, and CPU resources in determining a solution.

Using a circuit simulator such as Spice, the simulation involves performing numerous calculations including matrix inversions and other linear algebra operations. The results from these calculations will be an exact solution. Circuit simulation, especially for very large circuit networks, is time consuming because many calculations need to be performed and the types of calculations are generally computationally complex.

An approximation or reduction method of circuit simulation may be used obtain an estimated solution instead of an exact solution. These types of software programs may be referred to as circuit estimators. Circuit estimators obtain simulation results faster than a circuit simulator like Spice by throwing away circuit information. What particular information gets thrown away will vary depending on the approach used. Throwing away information reduces the amount of the information that needs to be considered in the calculations and speeds up the calculations. The results, however, are an estimate rather than an exact solution of the network.

Compared to a circuit simulator like Spice, a circuit estimator obtains results generally faster. The estimated solution is expected to be close to the exact solution, but the degree of closeness is not quantified for the user. This invention provides a technique to evaluate or validate the results of an estimated solution of a network simulation. The invention answers the question, "How much is the estimated result off by?"

In an implementation, a validation method of the invention includes:
(1) Build graph.
(2) Find tree and links.
(3) Find loops.
(4) Calculate KCL.
(5) Calculate KVL.

(6) Calculate power conservation.

(7) Provide error output.

KCL refers to Kirchhoff's current law: The algebraic sum of all the instantaneous currents leaving (or entering) any node of a circuit is identically zero for all time. KVL refers to Kirchhoff's voltage law: The algebraic sum of all of the instantaneous voltage drops or rises encountered in traversing any loop of a circuit (network) is identically zero for all time. Power conservation refers to the algebraic sum of all of instantaneous power input into the whole network is identically total sum of power consuming in the whole circuit (network). In other words, input power is equal to consumed power of the whole network.

The above validation method presents steps in a specific order. An implementation of the invention performs the steps in the given order. However, in other implementations of the invention, they may be other steps includes or some steps may be omitted, or the order of the steps may be different from above. For example, the KCL, KVL, and power steps are order independent. Therefore, in an embodiment, the calculations for KVL may be performed before the calculations for KCL. In another embodiment, the calculations for KCL and KVL may be performed in the same step. Some steps above may be performed at the same time on different processors or processor cores in a parallel processing implementation. In other embodiments, the steps may be (1) KCL, power, KVL; (2) KVL, KCL, power; (3) KVL, power, KCL; (4) power, KCL, KVL; or (5) power, KVL, KCL. There are many alternatives and implementations of the invention and any of these may be used to validate estimated simulation results.

Figure 4:
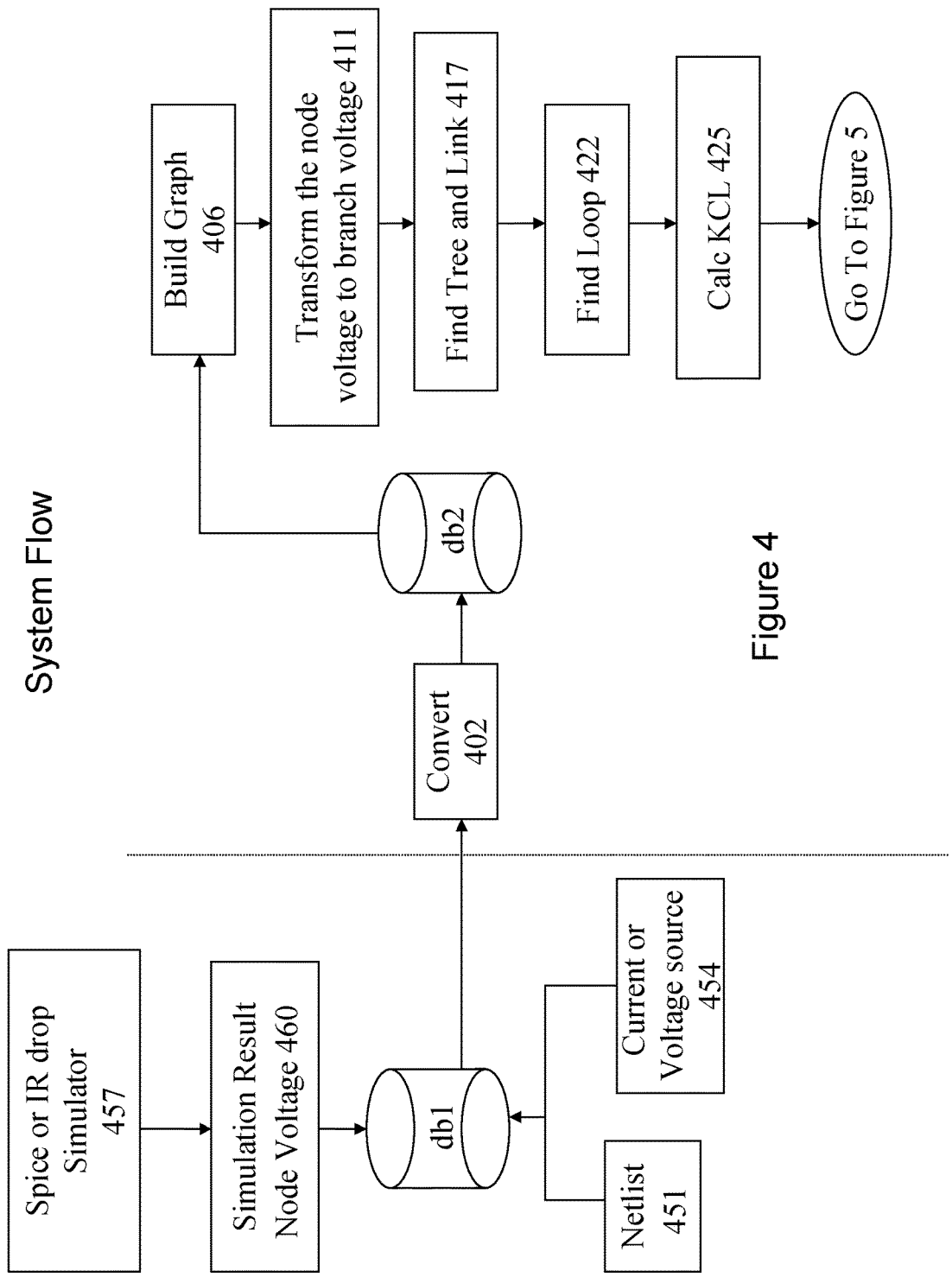
FIGS. 4 and 5 show a system flow diagram of the invention.
Figure 5:
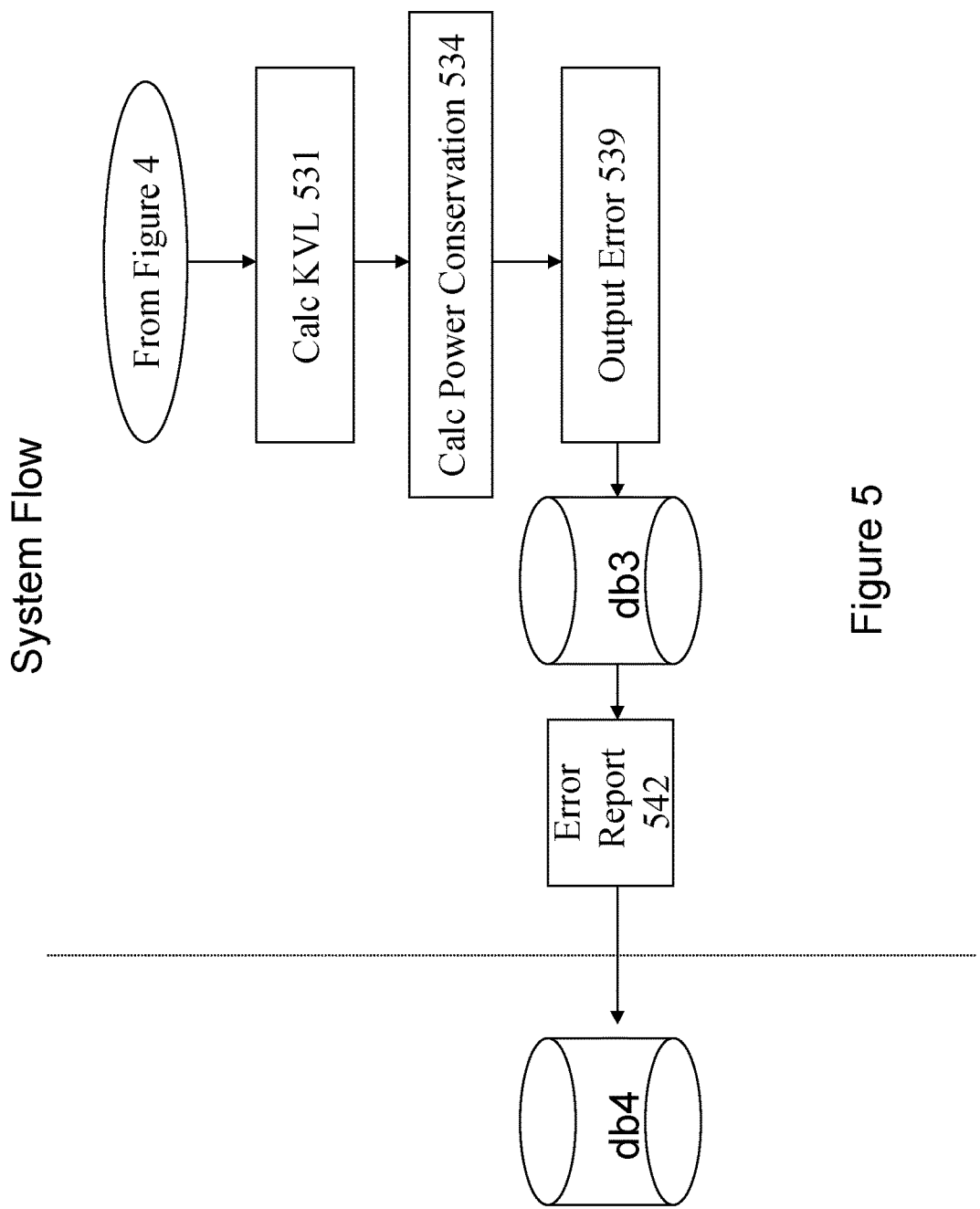

FIGS. 4 and 5 show a system flow diagram of a specific implementation of the invention. In the system flow, there is a database db1 which contains the network to be validated. In an embodiment, database db1 contains the circuitry and results that will be evaluated. The original circuitry may be provided by way of a netlist 451 or other suitable technique for specifying a circuit such as schematic capture. The netlist may be provided in a format such as DSPF. The netlist may be generated by extraction from a layout. Input sources 454, such as current or voltage sources, or both, of the original circuitry are specified too. The sources may include independent voltage sources, independent current sources, dependent voltage sources, or independent current sources, or any combination of these.

The results, such as node voltages or values, to be validated may be from Spice, circuit simulator, IR (voltage) drop estimator, or other circuit characteristic estimation software 457. The results from a standard Spice circuit simulator may be validated, but since this type of Spice circuit simulator provides exact results, there is not truly a need to validate these results, unless perhaps a person wants to debug the software. The results of Spice circuit simulator will validate using the techniques of the invention, showing that the results are accurate. Typically, the results 460 that are validated are from a circuit simulator providing estimated simulation results according to an approximation or reduction technique.

In an embodiment, simulation results 460 include node voltages for the nodes of a circuit of a netlist. The simulation results may be a listing of node names or node number and corresponding voltage value for that node. These results may be stored in database db1. Circuit estimators may not give results for each and every node of the circuitry. This is because in order to speed up the calculations, information may be thrown away. In an embodiment, in the case there are missing nodes (i.e., nodes of the original circuitry where no voltage value is provided), the validation technique will not evaluate or validate the simulation results because not enough data is available. The technique will inform the user that nodes are missing. The missing nodes may be shown on a display for the user. The user may be able to rerun the circuit estimation software to specify all nodes, and if all nodes are provided, then the validation technique may be used to validate the results.

These will be put into database db1. In an implementation of the invention, the node voltages, netlist, and sources are held in contained in a single database db1. However, in other implementations of the invention, the information may be held in separate databases. For example, node voltages may be in a first database, netlist in a second database, and sources in a third database. There may be any number of databases and the information may be held in the databases in any combination.

A conversion routine 402 converts db1 into a branch database db2. The branch database has node numbers for each node, branch impedance for each branch, voltage sources, and current sources.

Figure 6:
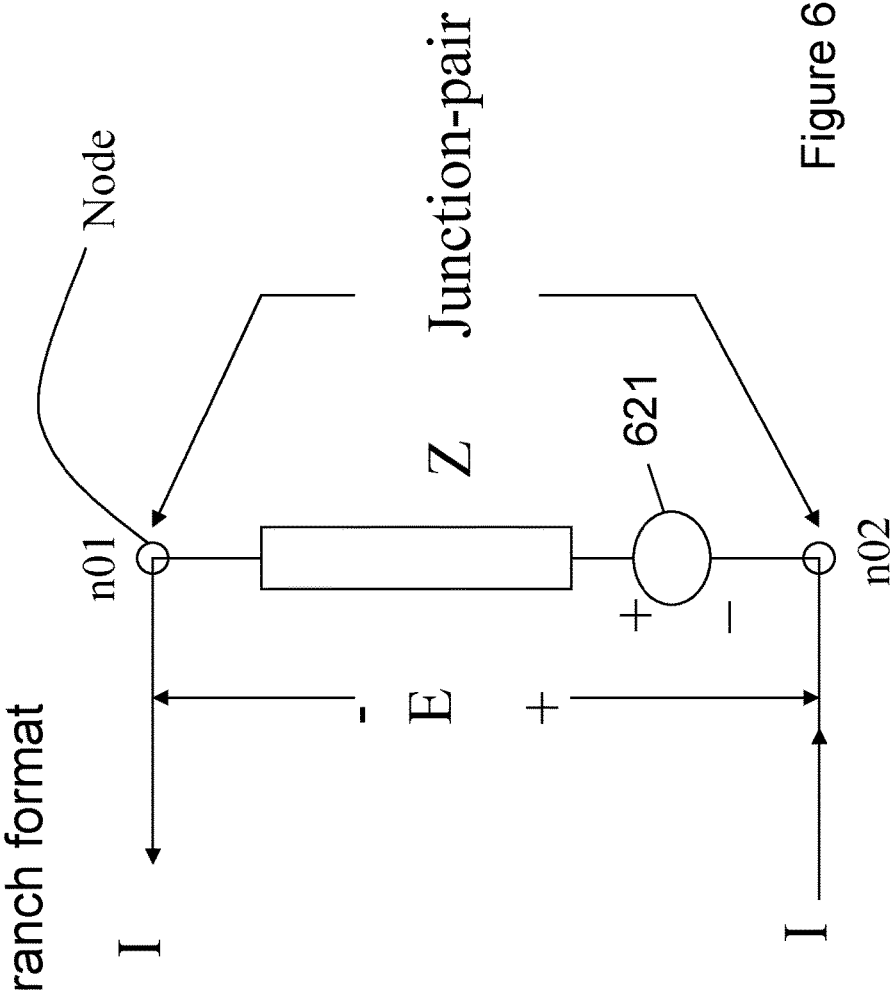
FIG. 6 shows an example of branch format data.

FIG. 6 shows an example of branch format data. The conversion routine may convert a netlist into branch format as shown, including many numbers of such branches. Between two nodes n01 and n02, there is a branch including an impedance Z and source 621. Nodes n01 and n02 form a junction pair. The impedance may include resistance, capacitance, or inductance. In an alternative implementation of the invention, admittance may be used. In electrical engineering, the admittance Y is the inverse or reciprocal of impedance. Source 621 is an independent voltage source. There may be another source, an independent current source (not shown), in series with I. Furthermore, there may also be dependent voltage sources or independent current source, or combinations of all the different types of sources. Each junction pair may have a current I and voltage or potential E associate with it.

Figure 7:
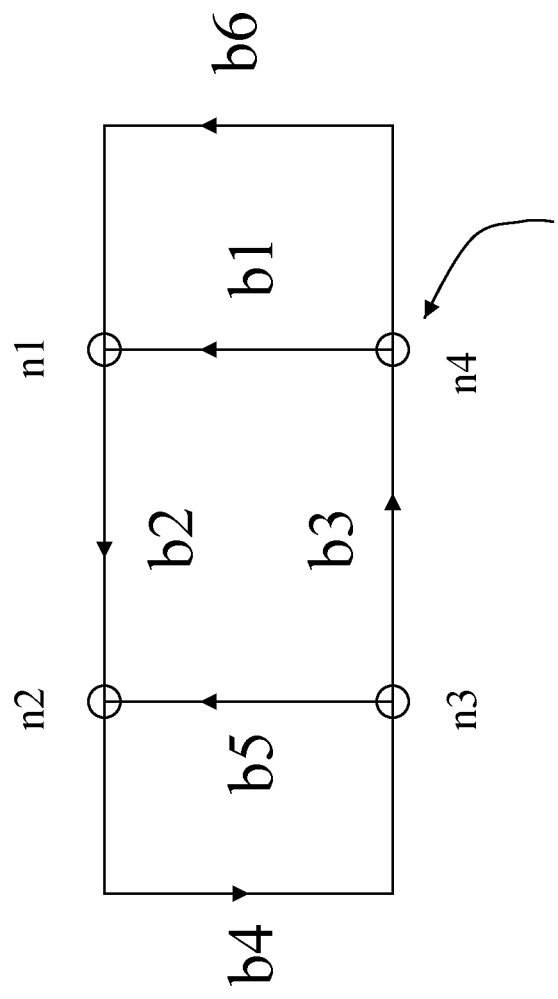
FIG. 7 shows building a graph from a network.

In the system flow of FIG. 4, from the branch database, the system flow includes building a graph 406. FIG. 7 shows an example of building a graph. Building a graph takes the circuit and builds the circuit connectivity into a graph data structure. A circuit has nodes and branches. The branches may have devices, sources, or other components. FIG. 7 is a circuit with branches and four nodes n1, n2, n3, and n4.

To build a graph, any node may be selected as a reference node. For example, node n4 may be selected as the reference node. The user may specify the reference node. The reference node is a node to which other nodes or parts of the circuitry are referenced. The reference node selected does not need to be the "ground" of the circuit. Nodal voltages for each of the nodes may be provided or reported as a voltage in reference to the reference node. Starting at node n4, tracing of the circuit branches proceeds as follows: b1, b2, b3, b4, b5, b3, and b6.

In an implementation, the graph data structure is stored in a database. This database has two tables. A first table is a branch table data structure which points to the two end of a branch. A second table is a node table which points to branches connected to the same node. In other implementations, the graph data structure may include more than two tables. And the tables may be stored in more than one database.

A circuit component is represented using a branch such as shown in FIG. 6. More specifically, each tree branch represents resistance-capacitance-inductance (RCL) and one or more sources, such as current source, voltage source, dependent current source, and dependent voltage source. A device model for a transistor or other device is a RCL network with a dependent source. Therefore, each transistor of the circuit will be a branch in the network graph. The entire graph is a RCL network with sources.

Figure 10:
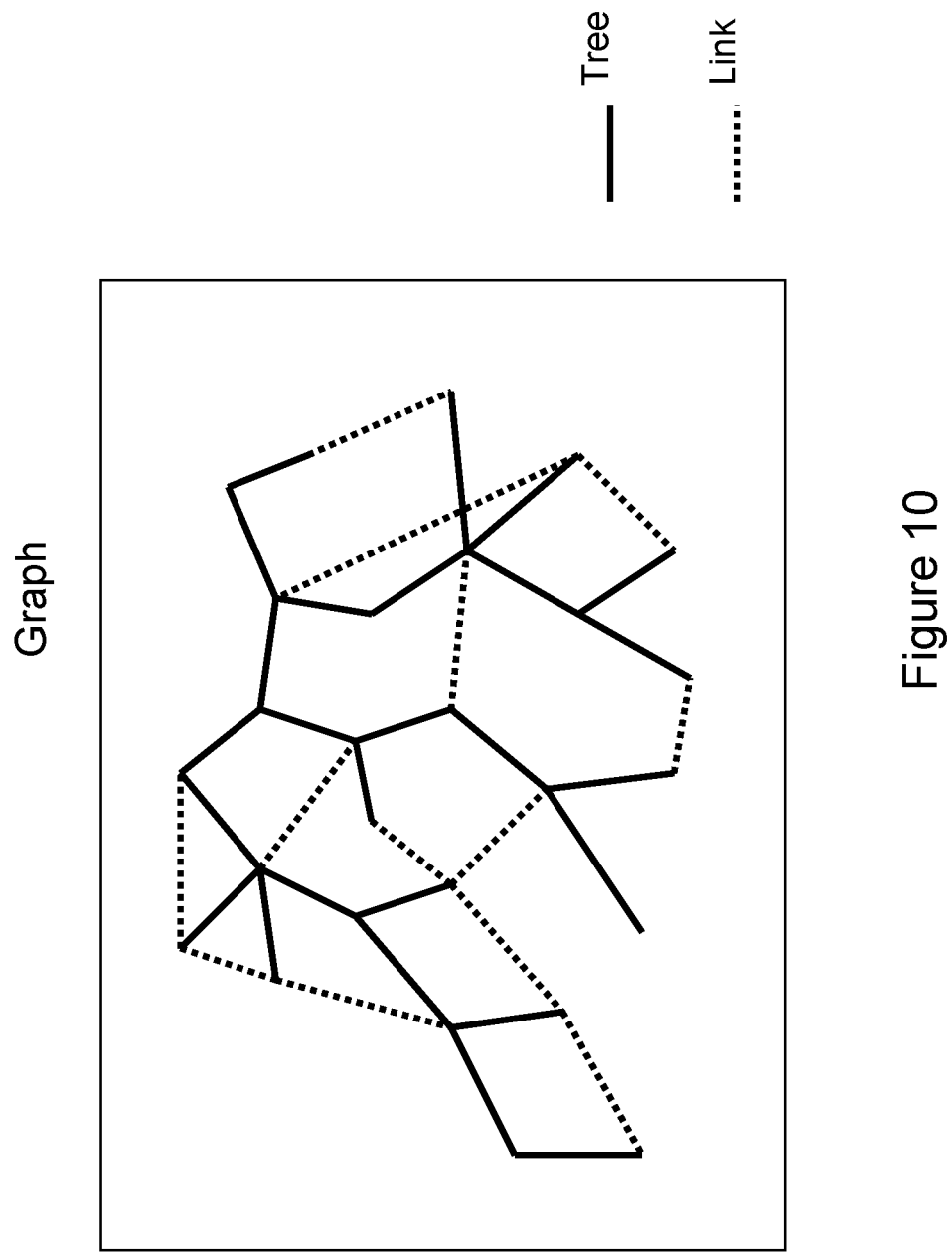
FIG. 10 shows a graph of a tree and links.

FIG. 10 shows a graph of a tree and links. Tree branches are shown using solid lines, and links are shown using broken lines. In a graph, some information is associated with each node and edge. For example, a node of the graph may be a node in the circuit and edge may be a branch in the circuit. A graph is an abstract data type that consists of a set of nodes and a set of edges that establish relationships or connections between the nodes. A specific technique, among others, to implement a graph data structure is to use doubly linked lists over the nodes and the ingoing and outgoing edges of the nodes. Another technique to implement a graph is to use an array structure. There are many other approaches to implementing a graph data structure in a computer system, and any of these may be used.

Figure 8:
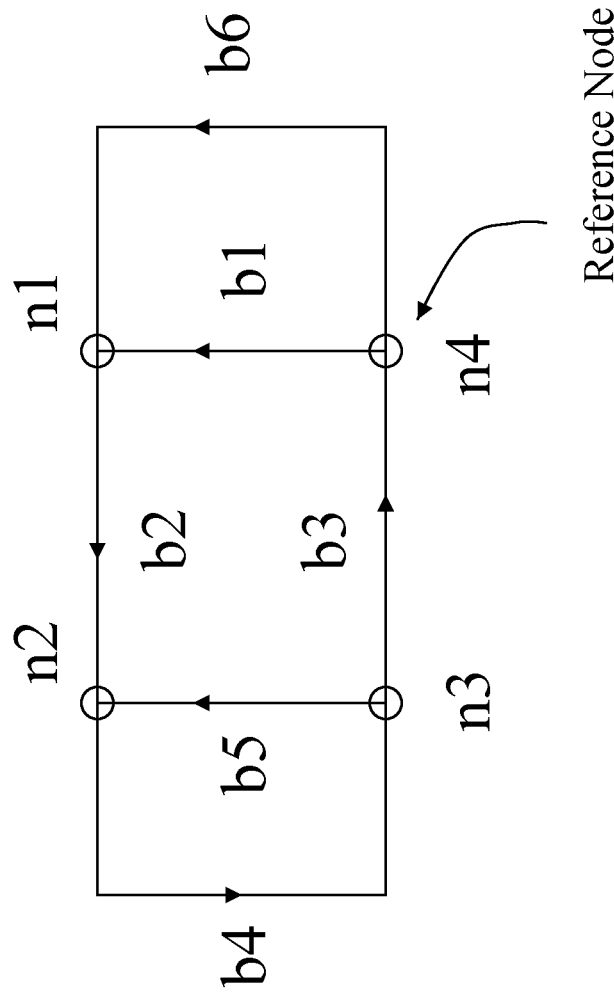
FIG. 8 shows transforming node voltages to branch voltages.

In the system flow of FIG. 4, after building a graph, the technique includes transforming the node voltage to the branch voltage 411. FIG. 8 shows transforming node voltages to branch voltages. Finding branch value includes finding voltages for each branch. Node voltages 460 are provided. The branch voltage is the voltage across two nodes. For example, a branch b1 is between two nodes n1 and n4, where a node voltage at n1 is 5 volts and a node voltage at n2 is 3 volts. The branch voltage for branch b1 will be n1-n2, which is 2 volts.

Figure 9:
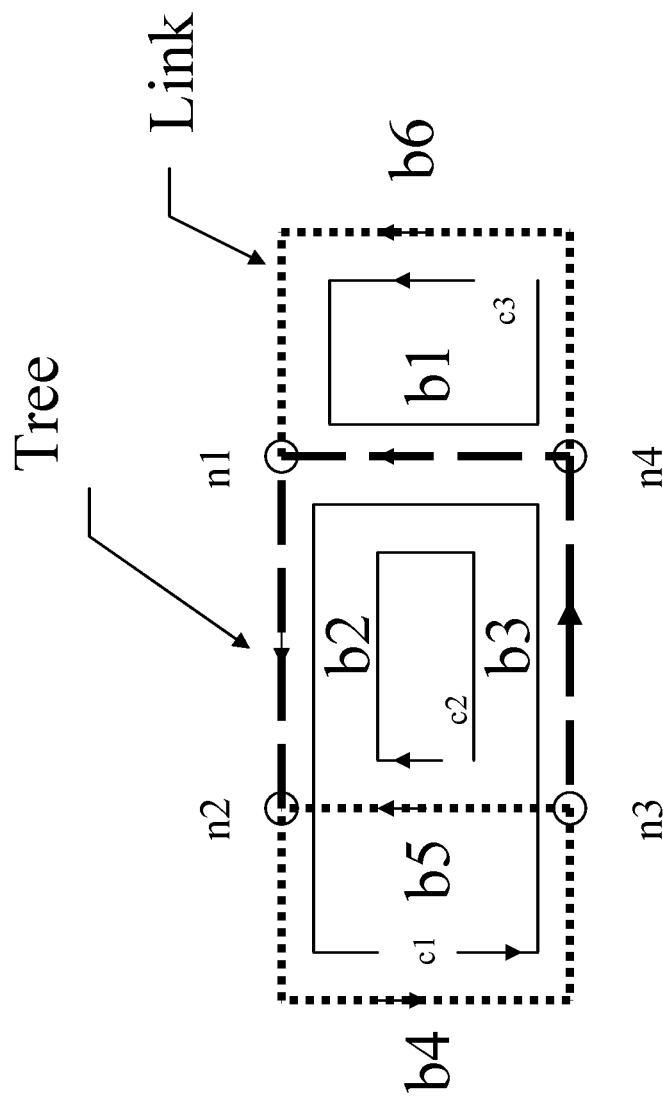
FIG. 9 shows finding a tree and links.

In the system flow of FIG. 4, after transforming the node value to branch value, the technique includes finding tree and links 417. FIG. 9 shows finding tree and links. Branches and links of the tree are identified in a given network.

A tree of a graph is a connected subgraph that includes all the nodes of the graph but contains no loops. A loop is a circular path from a first node through other nodes and returning to the first node. A loop has a voltage drop of zero. A subgraph of a graph is a set of branches and nodes belonging to a graph. A link forms a loop with one or more tree branches, and may be referred to as a unit link. A tree branch does not form a loop. Typically, a circuit or system has one tree and multiple links. FIG. 10 shows an example of a graph with a tree, nodes, branches, and links. A circuit network is represented using such a graph data structure.

There are many techniques to identify trees and links. One approach is a depth first search. Another technique is a breadth first search. Either of these may be used or a combination of these two may be used. For example, one technique of finding a tree involves starting at a starting node. This node can be any node in the graph. Depending on which node is selected as the starting node, the tree may be different from a tree found using a different starting node. Proceeding branch by branch through the graph, each branch of the graph will be designated as a tree or link to create a graph, such as in FIG. 10.

In the circuit network of FIG. 9, the tree is shown using dashed lines, and the links are shown using dotted lines. The circuit has nodes n1, n2, n3, and n4. There is a tree including branches b3, b1, and b2. Branch b3 is from node n3 to n4. Branch b1 is from node n4 to n1. Branch b2 is from node n1 to n2. There in are three links, b4, b4, and b6.

In the system flow of FIG. 4, after finding tree and links, the technique includes finding loops 422. As discussed above, a loop is a circular path from a first node through other nodes and returning to the first node. In an implementation, finding loops involves finding the fundamental independent loops. These are loops which do not contain other loops. For a given network, there may be any number of fundamental independent loops. Each of the loops found may be stored in a loop table.

The circuit network in FIG. 9 has three loops c1, c2, and c3. Link b4 forms loop c1 with branches b3, b1, and b2. Link b5 forms loop c2 with branches b3, b1, and b2. Link b6 forms a loop c3 with branch b1.

In the system flow of FIGS. 4 and 5, the technique includes calculating KCL 425, calculating KVL 531, and calculating power conservation 534. As discussed above, the order of performing the KCL, KVL, and conservation of power may vary. In a specific implementation of the invention, the KCL, KVL, and power conservation are evaluated in order to determine the validity of the simulation results. Calculations for KCL will not be omitted. Calculations for KVL will not be omitted. Calculations for power conservation will not be omitted.

In other implementations of the invention, one or more of the calculations for KCL, KVL, or power conservation, and any combination of these, may be performed. These implementations may omit calculations or using calculations for one or more KCL, KVL, or power conservation. However, the results including KCL, KVL and power conservation, not omitting any of these calculations and considering all results, will provide the greatest level of confidence and correctness in validating simulation results.

By omitting one or more of the KCL, KVL, or power conservation calculations or results, validation may not be proper. In particular, for some estimated simulation results, the KCL calculations validate without errors, but the KVL calculations have errors. This means that the estimated simulation results are not simulating the proper circuit. There is some error in the approximation made. If the validating technique omits the KVL calculation, this error would not have been noticed. This is similarly the case for KCL and power conservation.

FIG. 4 shows calculating or evaluating Kirchhoff's current law (KCL) in step 425. One technique of evaluating KCL is summing the currents into each node of the network. The sum for each node may be referred to as a node sum for a particular node.

For the example in FIG. 9, the KCL for node n1 would be a sum of i(b1)+i(b2)+i(b6), where i(bx) is the current through the branch x. A convention may be used so a current going into a node is negative, while current going out of a node is positive. Alternatively, a convention may be used so a current going into a node is positive, while current going out of a node is negative. The KCL would be calculated for nodes n1, n2, n3, and n4 of the network.

According to Kirchhoff's current law, the sum for each node should be zero. When the sum of the current for a node is not equal to zero, the circuit estimator software has made an error at this node. One or more of the currents associated with this node are incorrect. When a node violates Kirchhoff's current law, this is a validation error. There may be any number of nodes that have errors. Any error may be reported to the user and the node or nodes identified. The currents and branches may be listed. More detail on the reporting of errors is discussed below.

The magnitude of the difference between a node sum and zero may indicate a degree of error in the estimated simulation results. In other words, in an embodiment, the greater a node sum differs from zero, the greater the error in the estimated calculations. Further, when a greater number of nodes in the network have errors, this may indicate greater severity in the errors in the estimated simulation results. The node sum results for a network may be summarized in an index, such as from 1 to 10, to indicate the closeness of the results to the exact results. For example, an index value of 10 would indicate exact results, while a 1 would indicate very bad results, perhaps even random numbers.

FIG. 5 shows calculating or evaluating Kirchhoff's voltage law (KVL) in step 531. One technique of evaluating KVL is summing the branch voltages for each independent loop of the network. The branch voltages were determined during step 411 of FIG. 4. The sum for each loop may be referred to as a loop sum for a particular loop.

For the example in FIG. 9, the KVL for loop c1 would be v(b4)+v(b3)+v(b1)+v(b2), where v(bx) is the voltage of branch x. The KVL would be calculated for the loops of the circuit, c1, c2, and c3.

According to Kirchhoff's voltage law, the sum for each loop should be zero. When the sum of the branch voltages for a loop is not equal to zero, the circuit estimator software has made an error the voltages of this loop. One or more of the voltages associated with this loop are incorrect. When a loop violates Kirchhoff's voltage law, this is a validation error. There may be any number of loops that have errors. Any error may be reported to the user and the loop or loops identified. The voltages and branches may be listed. More detail on the reporting of errors is discussed below.

The magnitude of the difference between a loop sum and zero may indicate a degree of error in the estimated simulation results. In other words, in an embodiment, the greater a loop sum differs from zero, the greater the error in the estimated calculations. Further, when a greater number of loops in the network have errors, this may indicate greater severity in the errors in the estimated simulation results. The loop sum results for a network may be summarized in an index, such as from 1 to 10, to indicate the closeness of the results to the exact results. For example, an index value of 10 would indicate exact results, while a 1 would indicate very bad results, perhaps even random numbers.

FIG. 5 shows calculating or evaluating whether the network satisfies conservation of energy or power conservation in step 534. Conservation of energy is also known as the first law of thermodynamics. A technique of evaluating power conservation is finding the total consumed power of the circuit network and comparing this to the total input power to the circuit network.

Total consumed power may be found by summing the power consumed by each branch of the circuit network. The power consumed by each branch is the product of current and voltage (I*V) for a branch. For the example in FIG. 9, the consumed power will be i(b1)*v(b1)+i(b2)*v(b2)+i(b3)*v(b3)+i(b4)*v(b4)+i(b5)*v(b5)+i(b6)*v(b6). The total input power will be given provided by sources 454 (see FIG. 4) in the original circuit specification.

According to power conservation, the total input power minus the consumed total consumed power should be zero. This quantity may be referred to as a power error quantity. In the quantity is not zero, there is a validation error and the circuit estimator has made an error. Currents or voltages, or a combination, of the one or more branches is incorrect. The magnitude of the difference between the power error quantity and zero may indicate a degree of error in the estimated simulation results. Further, the magnitude of the difference (e.g., difference, percentage difference, or ratio) between the consumed power and input power may indicate a degree of error in the estimated simulation results. For example, if the consumed power is 50 percent of the input power, there is a clear error is the estimates provided by the circuit estimator.

In the system flow of FIG. 5, the technique includes outputting error 539. The error output is stored in a database db3. In another embodiment, instead of storing the error output in database db3, the results may be stored in database db2. Using database db3, an error report 542 is generated. This error report may be stored in a database db4. The error report may be generated using a reporting tool that processes or analyzes the data stored in database db3. Instead of storing the error report in database db4, the error report may be stored in database db1, db2, or db3.

In an embodiment, the error report indicates how close the results are to the exact results. Results may be provided for every node and branch, some nodes and branches, or selected nodes and branches. The degree of closeness may be given as (1) a value, such as a value difference between the approximate result and the exact result, (2) a percentage, such as a percentage difference between the approximate result and the exact result, or (3) whether a relationship between the approximate result and exact result satisfies a rule, where this rule may be user specified, or any combinations of these. And there may any number of rules, such as 1, 2, 3, 4, 5, 6, 7, 8, or more rules. A rule may be specified using Boolean expressions, operators, or other expressions, or combinations of these. A rule may be user defined.

As an example, a rule may be that there is an error if the percentage difference of a value (e.g., power, quantity associated with a node, branch, loop) is greater than a specific value, such as 5 or 10 percent. An example of a calculation to give a percentage difference is: ((exact result-approximate result)/exact result)*100. For example, the exact result quantity may be the input power, and the approximate result quantity may be the consumed power.

An absolute value of the percentage difference quantity may be used so that the quantity is not negative. A rule might be when ((exact result-approximate result)/exact result) is greater than a user-selected percentage (e.g., some value from 0 to 1), then highlight this approximate result. For the rule, any user-selected percentage may be used, such as 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, or greater. In an embodiment of the invention, the percentage for the rule may be hard coded, instead of user selected.

In an embodiment, the error report may be generated according to one or more rules defined by a user. The results of the validation are stored in database db3, and the reporting tool processes or analyzes these stored results. A user may change the rules or specify a different analysis, and then rerun the reporting tool to obtain new report results, without needing to perform the KCL, KVL, and power conservation calculations again.

The reporting tool may be run in a batch or interactive mode. The report tool may provide text output or may have a graphical user interface, or both. For example, a user may specify a graphic viewer reporting tool to highlight nodes or loops, or both, where the approximate results differ from the actual results by a particular amount or percentage, such as an approximate result off by more than 25 percent. As discussed above, any percentage may be used and the percentage may be user selected. As a further example, the report tool may highlight the nodes or loops, or both, where the results of the summing calculations is not zero.

In an embodiment, the results of each run of the reporting tool are stored in database db4. Therefore, if the user requests a report with results that have been previously determined, the reporting tool will determine that this has occurred and retrieve the previous results and not have to perform analysis or calculations on the data from database db3 again. This saves time in the reporting process.

For example, the user may request a listing of all nodes having a deviation or difference greater than a first value.

The results are generated from database db3 and stored in database db4. Then, the user requests a listing of all nodes having a deviation greater than a second value, which is different from the first value. These results are generated from database db3 and stored in db4. Then at a subsequent time, a user, which may be different from previous users, requests a listing of all nodes having a deviation or difference greater than a first value. The reporting tool recognizes this information is already available and retrieves it from database db4, without needing to consult database db3.

The technique for validating simulation results may be applied to DC or steady simulation or AC or transient simulation results. For validating AC simulation results, the above described approach may be applied incrementally at different time steps in order to validate the results at each time interval of the simulated results.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method comprising:
   receiving a circuit solution for the circuit network, wherein the circuit network comprises nodes and branches, and the circuit solution is stored in a computer-readable format;
   identifying a plurality of loops in the circuit network;
   for the circuit solution, summing voltages for each identified loop and storing loop sum results;
   for the circuit solution, summing currents at each node of the circuit network and storing node sum results;
   using at least one computer processor, for the circuit solution, summing power consumption of each branch of the circuit network and storing a total branch power;
   using at least one computer processor, validating the circuit solution by determining an error condition has occurred when the loop sum results has a value other than zero; and
   providing a user-discernable indication that the error condition has occurred.

2. The method of claim 1 comprising:
   using at least one computer processor, validating the circuit solution by determining an error condition has occurred when the node sum results has a value other than zero.

3. The method of claim 1 comprising:
   using at least one computer processor, validating the circuit solution by determining an error condition has occurred when the total branch power minus a total input power has a value other than zero.

4. The method of claim 1 wherein each identified loop is an independent loop.

5. The method of claim 1 wherein each identified loop is an independent loop, and an independent loop does not comprise other loops.

6. The method of claim 1 wherein each identified loop is an independent loop, and an independent loop is a fundamental loop.

7. The method of claim 3 wherein each identified loop is an independent loop.

8. The method of claim 3 wherein each identified loop is an independent loop, and an independent loop does not comprise other loops.

9. The method of claim 3 wherein each identified loop is an independent loop, and an independent loop is a fundamental loop.

10. A method comprising:
    receiving a circuit solution for the circuit network, wherein the circuit network comprises nodes and branches, and the circuit solution is stored in a computer-readable format;
    identifying a plurality of loops in the circuit network;
    for the circuit solution, summing voltages for each identified loop and storing loop sum results;
    for the circuit solution, summing currents at each node of the circuit network and storing node sum results;
    using at least one computer processor, for the circuit solution, summing power consumption of each branch of the circuit network and storing a total branch power;
    using at least one computer processor, validating the circuit solution by determining an error condition has occurred when the node sum results has a value other than zero; and
    providing a user-discernable indication that the error condition has occurred.

11. The method of claim 10 comprising:
    using at least one computer processor, validating the circuit solution by determining an error condition has occurred when the total branch power minus a total input power has a value other than zero.

12. The method of claim 10 wherein each identified loop is an independent loop.

13. The method of claim 10 wherein each identified loop is an independent loop, and an independent loop does not comprise other loops.

14. The method of claim 10 wherein each identified loop is an independent loop, and an independent loop is a fundamental loop.

15. A method comprising:
    receiving a circuit solution for the circuit network, wherein the circuit network comprises nodes and branches, and the circuit solution is stored in a computer-readable format;
    identifying a plurality of loops in the circuit network;
    for the circuit solution, summing voltages for each identified loop and storing loop sum results;
    for the circuit solution, summing currents at each node of the circuit network and storing node sum results;
    using at least one computer processor, for the circuit solution, summing power consumption of each branch of the circuit network and storing a total branch power;
    using at least one computer processor, validating the circuit solution by determining an error condition has occurred when the total branch power minus a total input power has a value other than zero; and
    providing a user-discernable indication that the error condition has occurred.

16. The method of claim 15 wherein each identified loop is an independent loop.

17. The method of claim 15 wherein each identified loop is an independent loop, and an independent loop does not comprise other loops.

18. The method of claim 15 wherein each identified loop is an independent loop, and an independent loop is a fundamental loop.

19. A method comprising:
receiving a circuit solution for the circuit network, wherein the circuit network comprises nodes and branches, and the circuit solution is stored in a computer-readable format;
identifying a plurality of loops in the circuit network;
for the circuit solution, summing voltages for each identified loop and storing loop sum results;
for the circuit solution, summing currents at each node of the circuit network and storing node sum results;
using at least one computer processor, for the circuit solution, summing power consumption of each branch of the circuit network and storing a total branch power;
using at least one computer processor, validating the circuit solution by determining an error condition has occurred when at least one of the loop sum results, node sum results, or the total branch power minus a total input power has a value other than zero; and
providing a user-discernable indication that the error condition has occurred.

20. The method of claim 19 wherein each identified loop is an independent loop, and an independent loop does not comprise other loops.

* * * * *